(12) United States Patent
Johnson

(10) Patent No.: US 6,317,074 B1
(45) Date of Patent: Nov. 13, 2001

(54) HIGH RANGE RESOLUTION RADAR THROUGH NON-UNIFORM SAMPLING

(75) Inventor: Lyle H. Johnson, Bloomington, MN (US)

(73) Assignee: Alliant Techsystems Inc., Edina, MN (US)

( * ) Notice: Subject to any disclaimer, the term of this patent is extended or adjusted under 35 U.S.C. 154(b) by 0 days.

(21) Appl. No.: 09/594,894

(22) Filed: Jun. 15, 2000

(51) Int. Cl.[7] ................................................. G01S 7/28
(52) U.S. Cl. .......................... 342/82; 342/83; 342/128; 342/200
(58) Field of Search ..................... 342/82, 83, 84, 342/85, 89, 91, 92, 93, 94, 95, 100, 101, 115, 128, 135, 175, 192, 195, 196, 198, 200, 203

(56) References Cited

U.S. PATENT DOCUMENTS

| 3,657,558 | 4/1972 | Patrickson | 307/228 |
|---|---|---|---|
| 3,783,392 | 1/1974 | Drake et al. | 328/127 |
| 4,430,641 | 2/1984 | Baur et al. | 340/347 |
| 4,539,565 | 9/1985 | Norsworthy | 343/14 |
| 4,593,287 | 6/1986 | Nitardy | 343/17.5 |
| 4,692,766 | 9/1987 | Rolfs | 342/200 |
| 4,754,277 | 6/1988 | Voiyce | 342/83 |
| 5,172,123 | 12/1992 | Johnson | 342/200 |
| 5,189,427 | 2/1993 | Stove et al. | 342/128 |
| 5,379,001 | 1/1995 | Hedtke | 331/4 |
| 5,642,081 | 6/1997 | Bosch et al. | 331/4 |
| 5,694,132 | * 12/1997 | Johnson | 342/200 |

* cited by examiner

Primary Examiner—John B. Sotomayor
(74) Attorney, Agent, or Firm—Vidas, Arrett & Steinkraus P.A.

(57) ABSTRACT

A frequency modulated continuous wave (FMCW) radar system having a voltage controlled oscillator (VCO) for transmitting a RF signal and a linearizer for linearizing the VCO. The FMCW receives the transmitted RF signal as an input and outputs a signal to a modulator, which successively sweeps the VCO frequency over a defined range. The receiver mixes a return signal with a sample of the transmitted RF signal to derive an IF signal. An adaptive frequency sample clock drives an analog to digital converter to sample and digitize the IF signal, with the clock being derived from the transmitted RF signal.

8 Claims, 14 Drawing Sheets

HIGH RANGE RESOLUTION RADAR THROUGH NON-UNIFORM SAMPLING

BACKGROUND OF THE INVENTION

1. Field of the Invention

The present invention relates to the field of electronic radar, and more particularly to apparatus for reducing the operating requirements on a linearizer by accounting for non-linearities in the transmitted waveform via processing in the radar receiver.

2. Description of the Related Art

A frequency modulated continuous wave (FMCW) radar system often uses linear frequency modulation to provide accurate range information. The resolution of the ranging information is directly dependent on the linearity of the transmit signal. A great deal of prior art exists related to linearizers. For example, applicant owns U.S. Pat. Nos. 5,642,081 and 5,379,001, both directed to closed loop linearizers. The entire contents of U.S. Pat. Nos. 5,642,081 and 5,379,001 are hereby incorporated by reference. Applicant also owns U.S. Pat. Nos. 5,172,123 and 4,692,766, which are directed to linearizers for FMCW radar transmitters, and the entire contents of U.S. Pat. Nos. 5,172,123 and 4,692,766 are hereby incorporated by reference.

Other prior art related to linearizers are found in U.S. Pat. Nos. 4,539,565, 4,593,287 and 4,754,277, all assigned to The Boeing Company. U.S. Pat. No. 5,189,427 assigned to U.S. Philips Corporation also relates to FMCW radar linearizers.

The prior art corrects for non-linearities in the transmitted waveform via further processing in the transmitter, which makes the transmitter circuitry unduly complicated. What is needed is a circuit which can correct for non-linearities in the transmitted waveform without unduly increasing the operating requirements on the transmitter circuitry.

SUMMARY OF THE INVENTION

Applicant has overcome the problems of the prior art by inventing a FMCW radar system which reduces the operating requirements on the linearizer portion of the transmitter circuitry by taking account of the non-linearities in the transmitted waveform via processing in the radar receiver.

This is accomplished by replacing the fixed frequency sample clock used to digitize the IF signal in the prior art FMCW radar system with a sample clock which is derived from the transmitted waveform itself. Rather than sample uniformly spaced in time using the fixed frequency sample clock, the inventive FMCW radar system shows small deviations from linearity as nonuniform time sampling, but uniform phase sampling in the receiver analog/digital (A/D) converter.

The output of the linearizer delay and mixing circuitry portion of the transmitter circuitry is multiplied in frequency, if necessary, by a fixed factor N, to achieve at least the Nyquist sampling rate, to directly become the A/D sample clock. As is well known in the art, the Nyquist sampling rate is the sample rate above which no aliasing or spectral overlap occurs.

BRIEF DESCRIPTION OF THE DRAWINGS

A detailed description of the invention is hereafter described with specific reference being made to the drawings in which.

DESCRIPTION OF THE PREFERRED EMBODIMENTS

Figure 1:
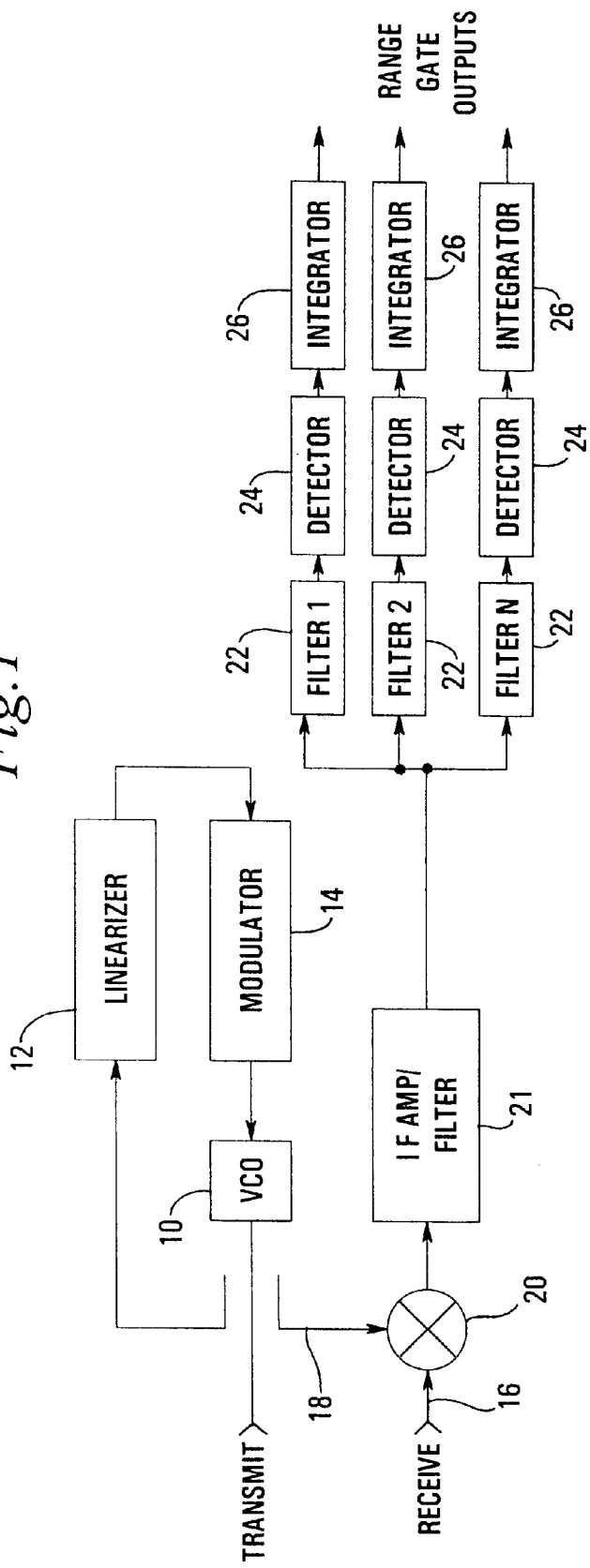
FIG. 1 is a block diagram showing a simplified prior art FMCW radar system.

While this invention may be embodied in many different forms, there are shown in the drawings and described in detail herein specific preferred embodiments of the invention. The present disclosure is an exemplification of the principles of the invention and is not intended to limit the invention to the particular embodiments illustrated.

FIG. 1 is a block diagram showing a simplified prior art FMCW radar system. As is well known in the art, a typical prior art transmitter includes a voltage controlled oscillator (VCO) 10 for transmitting a RF signal, a linearizer 12 for linearizing the VCO, which receives the transmitted RF signal as an input and outputs a signal to a modulator 14, which successively sweeps the VCO frequency over a defined range. For linear sweep modulation the transmitted frequency linearly changes from the starting to the stopping frequency over the modulation period. If the instantaneous frequency deviates from the linear frequency ramp during the modulation period, the linearizer 12 senses the deviation and feeds that error to the modulator to correct the deviation.

The prior art receiver typically mixes a return signal 16 with a sample of the transmitted RF signal 18 with receiver mixer 20 to derive an IF signal. The return signal 16 is a time-delayed version of the transmitted signal, aside from amplitude weighting due to path loss and target effects. While the signal returned from the target is in transit, the transmitter frequency continues to sweep. The frequencies of the two signals 16 and 18 then differ at the receiver by an amount equal to the product of the slope of the transmitted frequency vs. time and the time delay to the target and back. The receiver mixer 20 mixes the two signals 16 and 18 with the output, amplified and filtered at 21 resulting in an IF difference frequency proportional to range to the target. Simultaneous signals from several targets at different ranges are separated by a filter bank, each filter 22 corresponding to a different target range. The filter outputs are then detected at detectors 24, and integrated, if desired, with integrators 26, to form the radar range gate outputs.

The spectrum of the return signal 16 from an ideal target will be a single spectral line if the transmitted waveform is truly linear. Since the transmitted waveform is periodic, the return signal spectrum will consist of spectral lines spaced at intervals of 1/(modulation period T) Hz. The minimum width of the spectrum will be one spectral line. Nonlinearities in the transmitted waveform will broaden the return signal spectrum and reduce the peak power. The broadening limits the achievable range resolution and reduction in peak power reduces the signal-to-interference ratio and hence system probability of detection.

Figure 2:
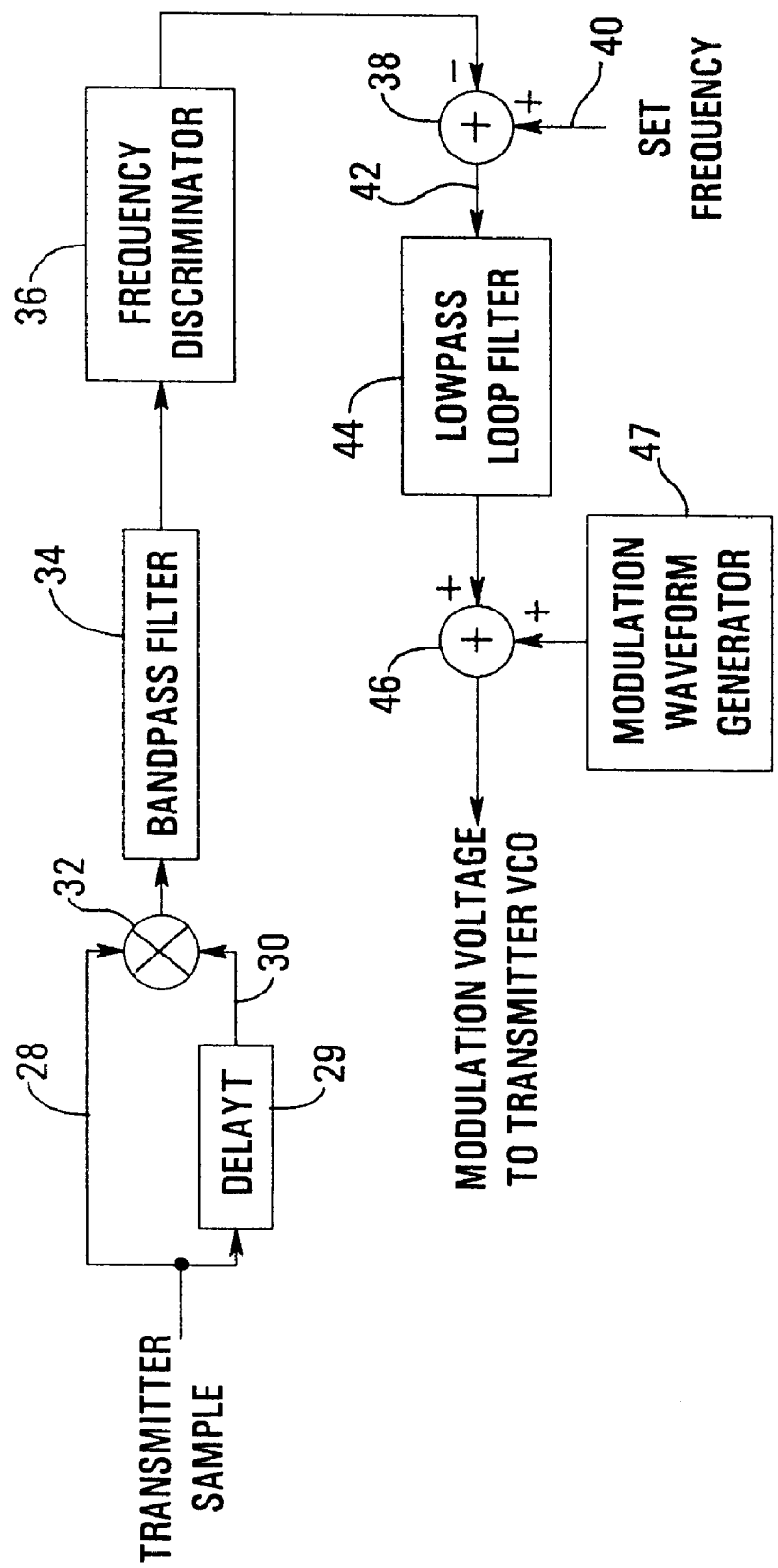
FIG. 2 is a block diagram showing a simplified prior art linearizer/modulator system.

FIG. 2 is a block diagram showing a simplified prior art linearizer/modulator system, with a sampled version of the transmitted signal 28 mixed with a time delayed version of the transmitted signal 30 at mixer 32, to form the difference frequency. The transmitted signal 28 is time delayed using delay device 29 as is well known in the art. The difference frequency will be constant if the transmitter waveform is linear and will change in proportion if the waveform is not linear. The difference frequency is filtered at 34 and the instantaneous difference frequency is measured by the frequency discriminator 36 and compared at 38 to the set value frequency 40. The error output signal 42 is filtered at lowpass loop filter 44 and added to the basic modulation waveform, produced with modulation waveform generator 47, at 46 to produce a tuning signal which frequency modulates the VCO 10.

Figure 3:
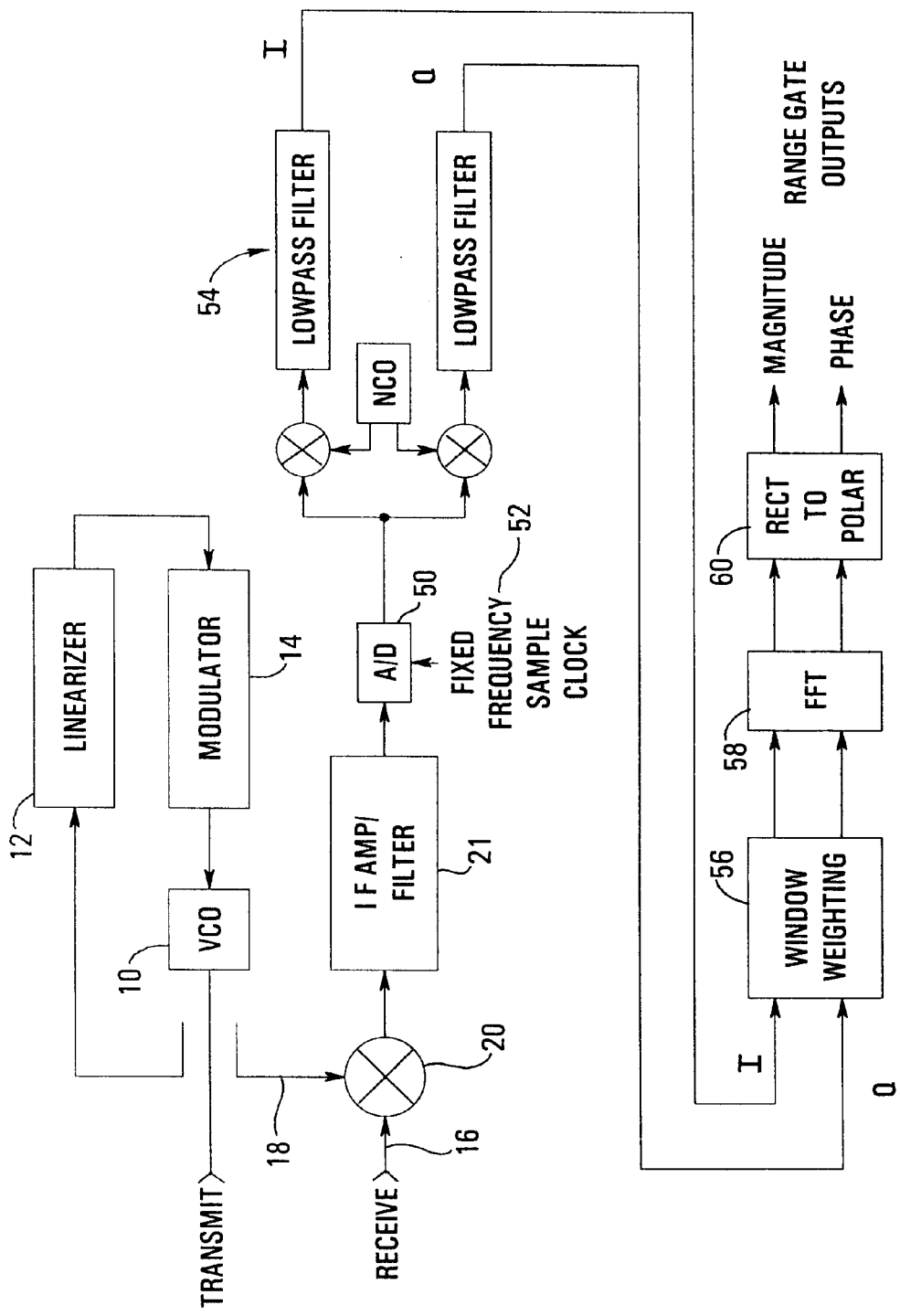
FIG. 3 is a block diagram of a digital receiver implementation of the FMCW radar system of FIG. 1.

FIG. 3 is a block diagram of a prior art digital receiver implementation of the FMCW radar system of FIG. 1, in which the receiver IF signal is sampled with an A/D converter 50 driven with a fixed frequency sample clock 52 and digitally downconverted to baseband with an I/Q mixer pair, shown generally at 54. The range gate filters are formed by Fourier transforming samples of the receiver IF signal, by inputting the I/Q signals to window weighting block 56, and performing the Fourier transform using FFT 58, and changing the coordinate system from rectangular to polar at block 60 to provide magnitude and phase outputs. This type of prior art digital receiver implementation is well known in the art.

Figure 4:
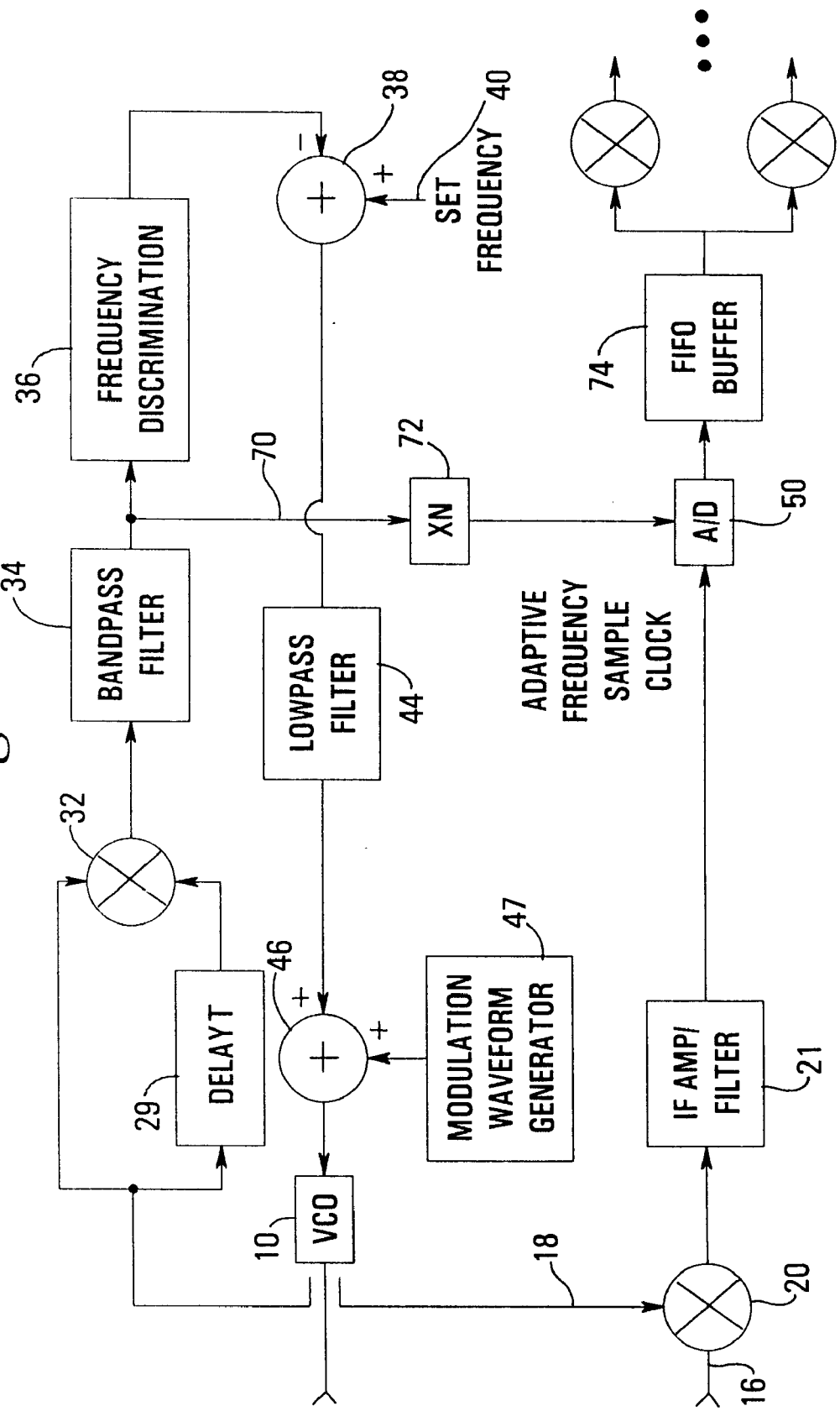
FIG. 4 is a block diagram of the inventive FMCW radar system.

FIG. 4 is a block diagram of the inventive FMCW radar system, which is similar to a combination of FIGS. 1–3, but with the A/D converter 50 being driven by a clock derived from the transmitted waveform itself The output signal 70 of the linearizer delay, mixing and filtering circuitry is multiplied in frequency at 72 by a fixed factor N, to achieve at least the Nyquist sampling rate (which is well known in the art), to directly become the A/D converter 50 sample clock. Thus small deviations from linearity will be reflected as nonuniform time sampling, but uniform phase sampling in the receiver AID converter 50. Signal 70 is exactly analogous to a nearly ideal target located in the radar field of view at a known distance, referred to hereafter as a fixed delay target.

The frequency multiplier 72 is a generic functional block used to generate a Nyquist frequency or higher sample clock for the A/D converter 50. The frequency of the signal 70 output from the bandpass filter 34 is dependent on the VCO 10 waveform slope and the duration of the delay 29. The Nyquist sample frequency for A/D converter 50 is determined by the pass band characteristics of IF amplifier/filter 21. The multiplication factor N in frequency multiplier 72 is the ratio of (A/D converter 50 Nyquist sample frequency) to (frequency of bandpass filter output signal 70) or greater. Depending on the particular combination of relevant parameters the generic frequency multiplier 72 maybe:

N>1 frequency multiplier;

N=1 not required, signal 70 may be used as is, or

N<1 frequency divider.

Uniform time sampling results in non-uniformly spaced samples of signal phase and broadening of the return signal spectrum when transmitter waveform nonlinearities are present. However, the instantaneous frequency of the fixed delay target (signal 70) exactly reflects the transmitter waveform nonlinearities (at least for that exact delay). Therefore, by using the fixed delay target instantaneous frequency as the A/D sample clock, transmitter nonlinearities can be removed or minimized because they are actually being measured in real time. The nonuniform sampling in time results in uniform sampling of return signal phase, which is just what is required to allow the FFT processing to produce the narrow signal spectrum expected. The sampled output of 50 may optionally be output to a FIFO buffer 74, which then outputs its signal to I/Q mixer pair 54. The FIFO buffer 74 accepts the A/D samples at irregular time intervals and outputs them at regular intervals to simplify operation of the I/Q mixer pair 54 hardware, discussed above in connection with FIG. 3.

Mathematical Model Of System Operation

The transmit frequency can be modeled as:

$$f_T(t) = f_o + Bt/T + A(t)$$

where A(t) describes the waveform frequency nonlinearities. The transmit phase is then the integral over time.

$$\Phi_T(t) = 2\pi \int_o^t f_T(t')dt'$$
$$= 2\pi \left[ f_o t + \frac{Bt^2}{2T} + \int_o^t A(t')dt' \right]$$
$$= \omega_o t + \beta t^2 + \alpha(t)$$

The transmit signal is (using the real part):

$$S_T(t) = \exp j\phi_T(t)$$

For the fixed delay path, the delayed phase and signal are:

$$\phi_{96}(t) = \phi_T(t-\tau)$$
$$S_\tau(t) = \exp j\phi_\tau(t) = \exp j\phi_T(t-\tau)$$

Mixing the transmit and fixed delay signals in the linearizer mixer generates the difference signal:

$$S_{\tau D}(t) = S_T(t)S_\tau^*(t) = \exp j\Phi_{\tau D}(t)$$
$$= \exp j(\omega_p t + \beta t^2 + \alpha(t) - \omega_o(t-\tau) - \beta(t-\tau)^2 - \alpha(t-\tau))$$
$$= \exp j(\omega_o t + 2\beta\tau t - \beta\tau^2 + \alpha(t) - \alpha(t-\tau))$$

If α(t)=0, no waveform nonlinearities, the difference frequency will be:

$$f_\tau = \frac{1}{2\pi} \frac{d}{dt}(\omega_o \tau + 2\beta\tau t - \beta\tau^2) = \frac{B\tau}{T}$$

as expected for a linear waveform.

The sample clock is derived from $S_{\tau D}$ with the frequency (phase) multiplied by a factor N.

$$S_s(t) = \sin[\phi_s(t)] = \sin[N\phi_{\tau D}(t)]$$

Sample times are the zero crossings of $S_s(t)$ or:

$$\phi_S(t_k) = 2\pi k$$
$$= N[\omega_o\tau + 2\beta\tau t_k - \beta\tau^2 + \alpha(t_k) - \alpha(t_k - \tau)]$$

or, rearranging, $$2\beta\tau t_k + \alpha(t_k) - \alpha(t_k - \tau) = 2\pi k/N - \omega_o\tau + \beta\tau^2$$

where k=0,1,2, . . . (choosing the rising crossing). The preceding equation is an equation in $t_k$ whose roots are the sample times. A system that implements this nonuniform sampling approach does not need to explicitly solve the above equation for the $t_k$. A zero crossing detector acting on Ss(t) provides the sample times directly. Notice that for arbitrary $\alpha(t)$:

$$S_{\tau D}(t_k) = \exp j(\omega_o\tau - \beta\tau^2 + 2\beta\tau t_k + \alpha(t_k) - \alpha(t_k - \tau))$$
$$= \exp j\left(\omega_o\tau - \beta\tau^2 + \frac{2\pi k}{N} - \omega_o\tau + \beta\tau^2\right)$$
$$= \exp j\left(\frac{2\pi k}{N}\right)$$

so the phase at the sample time $t_k$ is identical for $S_{\tau D}(t_k)$ whether or not the waveform is perfectly linear.

For a single point target in the field of the radar at range R the path delay $\gamma = 2R/c$.
Generalizing to multiple point scatters and evaluating at sample times $t_k$, the received difference signal is:

$$S_{rD}(t_k) = \sum_{m=1}^{M} b_m \exp j(\omega_o\gamma_m + 2\beta\gamma_m t_k - \beta\gamma_m^2 + \alpha(t_k) - \alpha(t_k - \gamma_m))$$

This expression generates the received signal time series present at the output of the A/D converter.

EXAMPLES

Suppose the nonlinearities in the waveform can be modeled by:

$$A(t) = \sum_{n=1}^{N_S} a_n \sin\left[\frac{n\pi t}{T}\right]$$

$$\alpha(t) = 2T\sum_{n=1}^{N_S} \frac{a_n}{n}\left(1 - \cos\left[\frac{n\pi t}{T}\right]\right)$$

For example purposes the sample times $t_k$ must be found numerically by solving:

$$\frac{2\pi k}{N} - \omega_o\tau + \beta\tau^2 = 2\beta\tau t_k + 2T\sum_{n=1}^{N_S} \frac{a_n}{n}\left(\cos\left[\frac{n\pi(t_k - \tau)}{T}\right] - \cos\left[\frac{n\pi t_k}{T}\right]\right)$$

k=0,1,2, . . .

These $t_k$ values are then substituted into $S_{RD}(t_k)$ to define the nonuniformly sampled time series of the IF target return signal. Fourier transforming the series results in a spectrum representative of the range gate outputs.

A radar system was defined with these characteristics:

| Parameter | Value | Units |
|---|---|---|
| $f_0$ | 0 | Ghz |
| B | 500 | MHZ |
| T | 0.01 | sec |
| $\tau$ | 0.512 | $\mu$sec |

Five unit-amplitude point targets were placed at delays of 0.1, 0.2, 0.5, 0.8, and 1.2 $\mu$sec. The radar parameters result in a waveform slope of 50 kHz/$\mu$sec. The target delays then correspond to IF difference frequencies of 5.0, 10.0, 25.0, 40.0, and 60.0 kHz.

Figure 5:
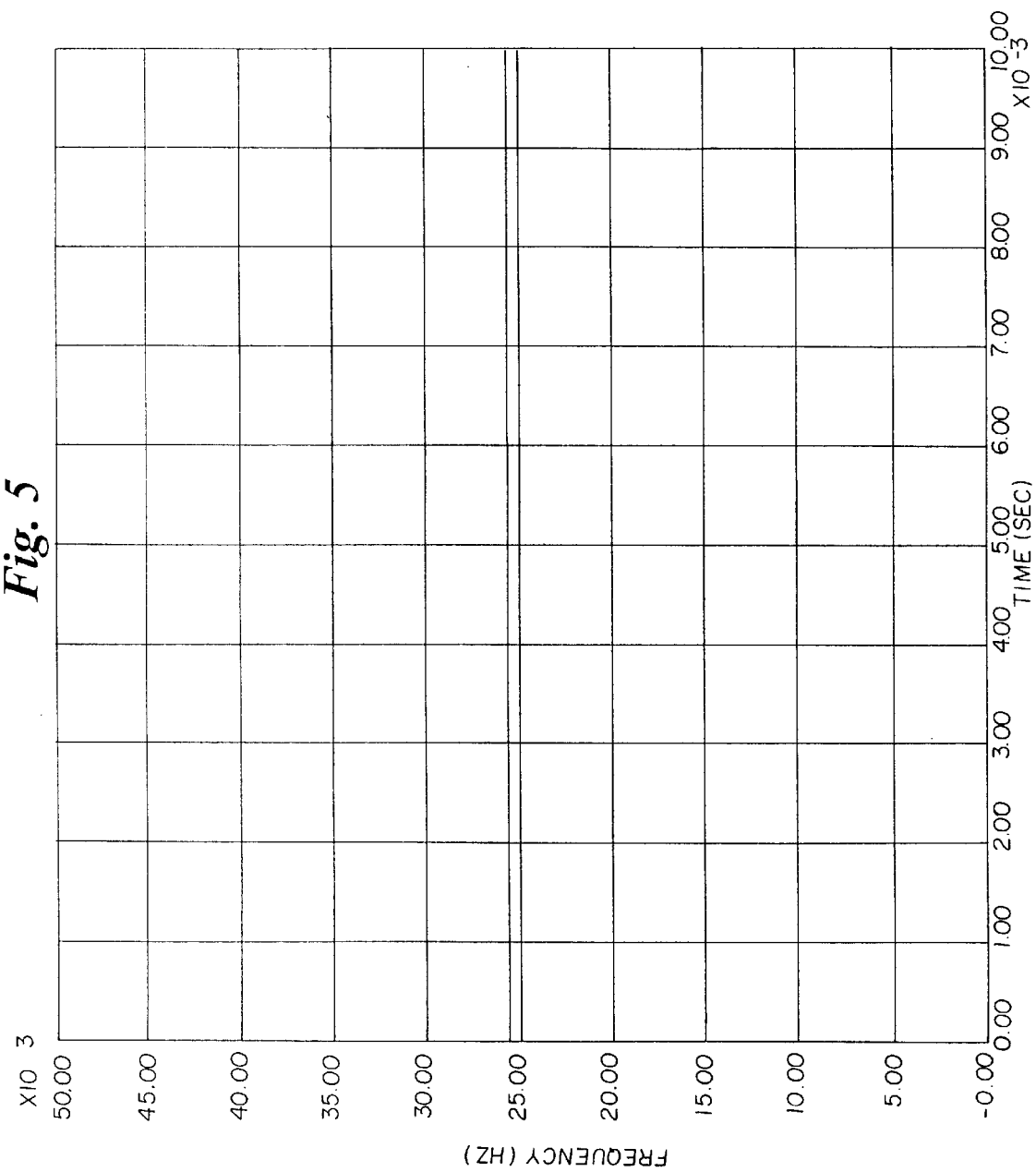
FIG. 5 is a graph showing a fixed delay target difference frequency over the modulation period with no transmitter waveform nonlinearities present.
Figure 6:
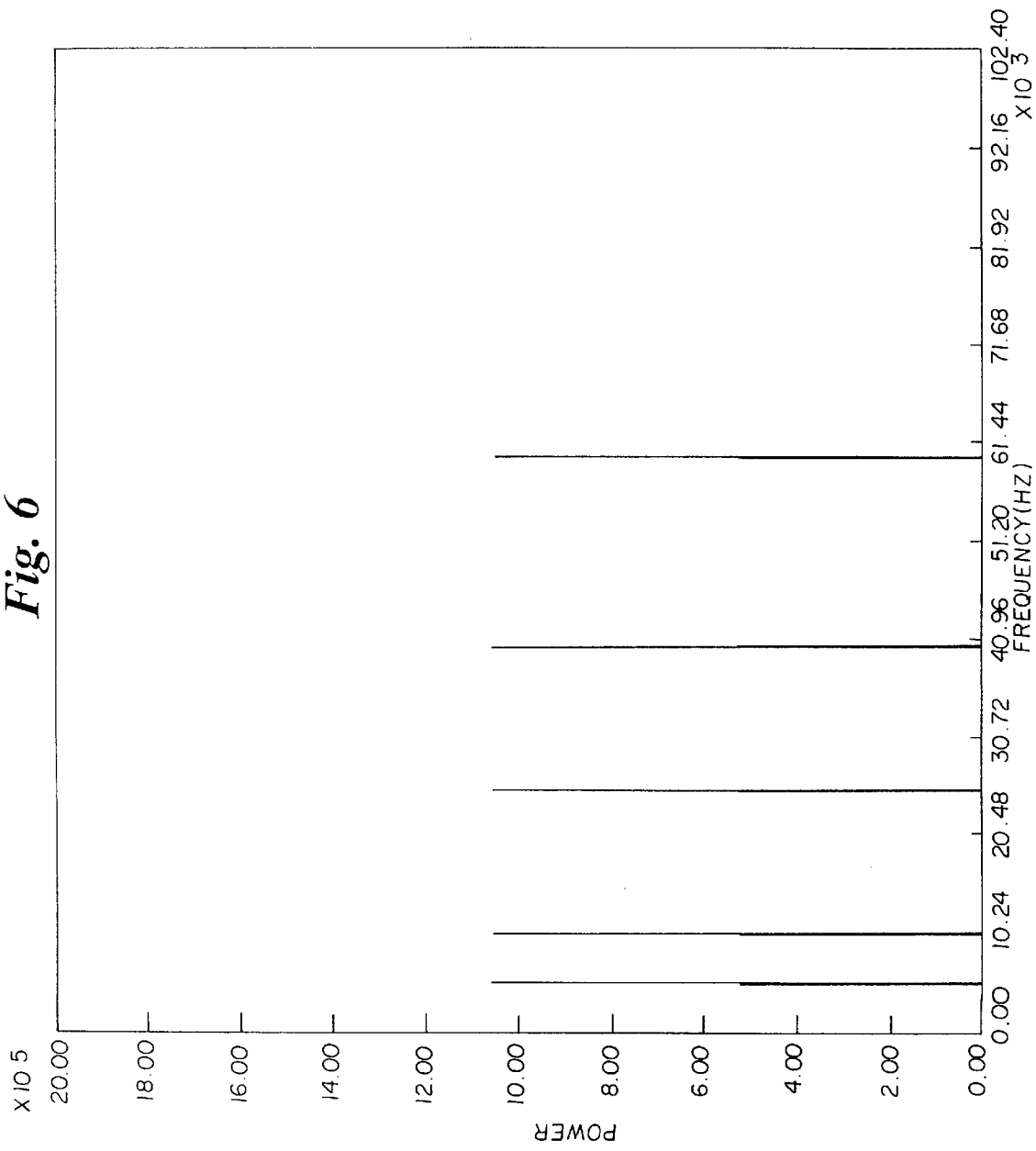
FIG. 6 is a graph showing the received spectrum of five point targets using a linear transmit waveform.

With a linear waveform the fixed delay target difference frequency over the modulation period is shown in FIG. 5. The frequency is constant as it should be with a linear sweep. The spectrum of the five point targets is shown in FIG. 6. The five spectral lines clearly identify the targets and are of equal power consistent with each being a unit-amplitude scatterer.

Figure 7:
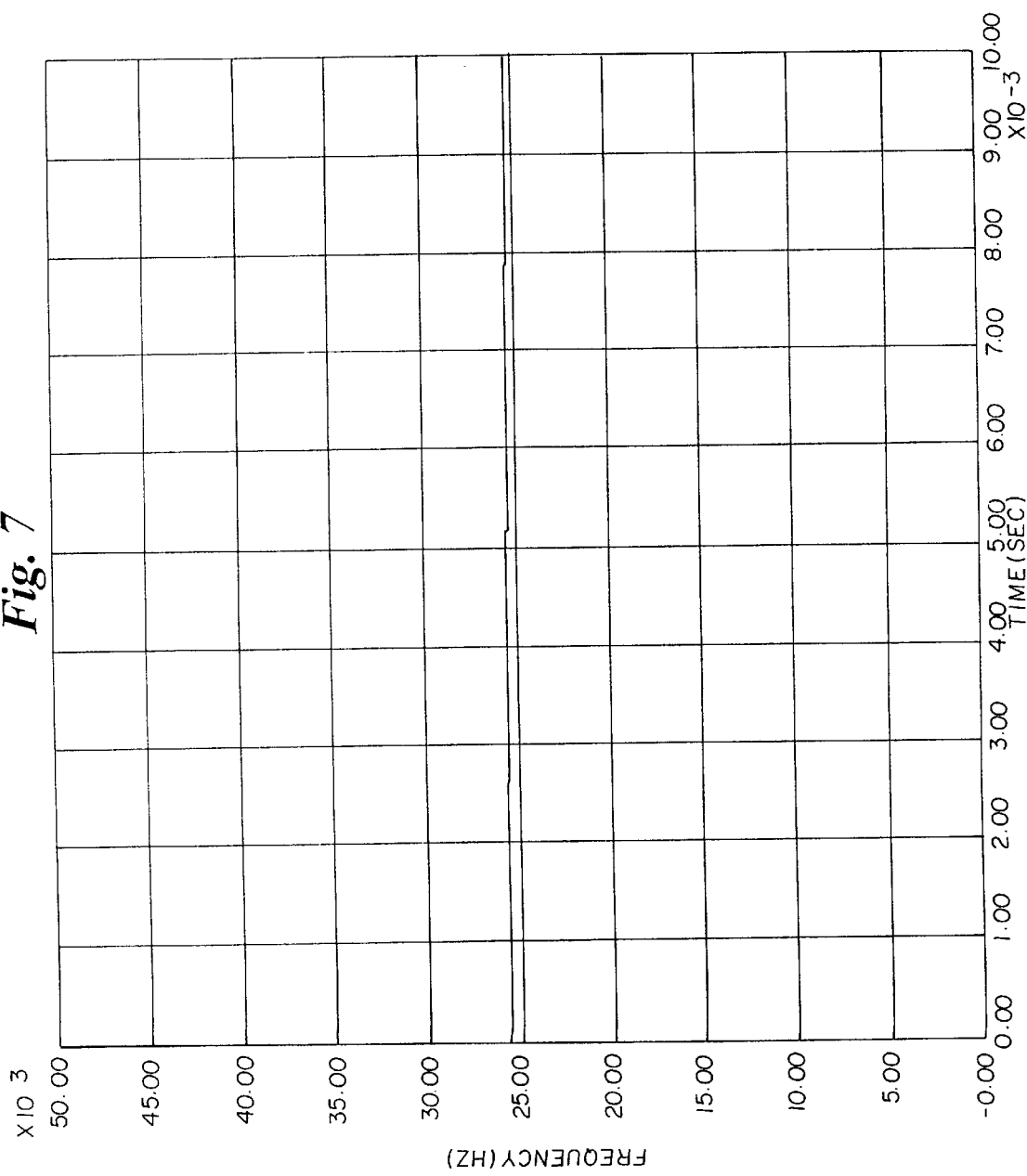
FIG. 7 is a graph showing the fixed delay target difference frequency when a nonlinear term is added to the transmitter waveform.
Figure 8:
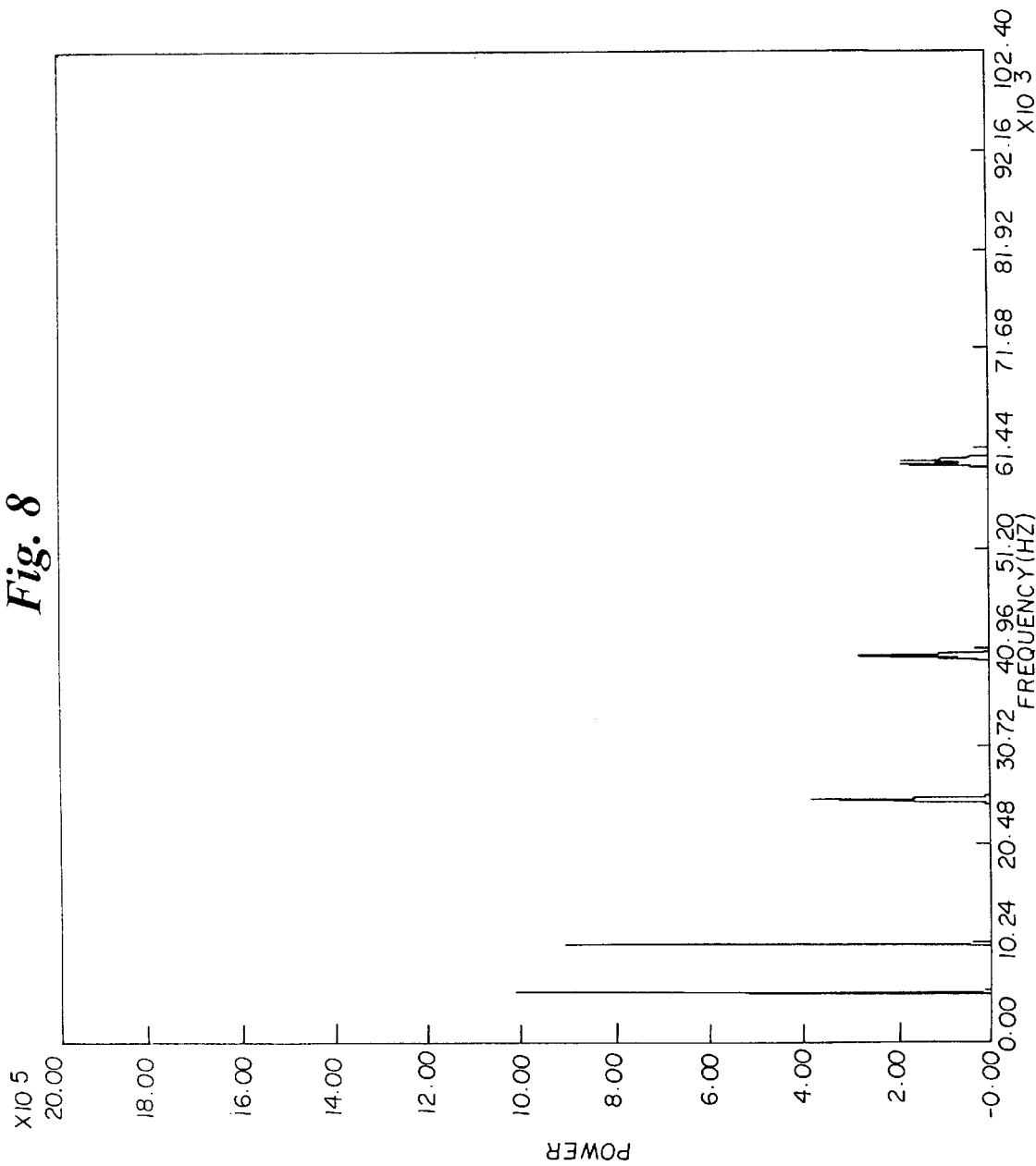
FIG. 8 is a graph of the resulting received signal spectrum using uniform time sampling.

For the next case $a_1=1.0$ MHZ was chosen. This adds a half-sinusoid nonlinearity to the transmit waveform. Now the fixed delay target shows a small change in difference frequency as shown in FIG. 7. The signal spectrum in FIG. 8 was computed using uniform time sampling and is dramatically impacted. Although still clearly separated in range, peak power drops and spectral width broadens as target delay increases.

Figure 9:
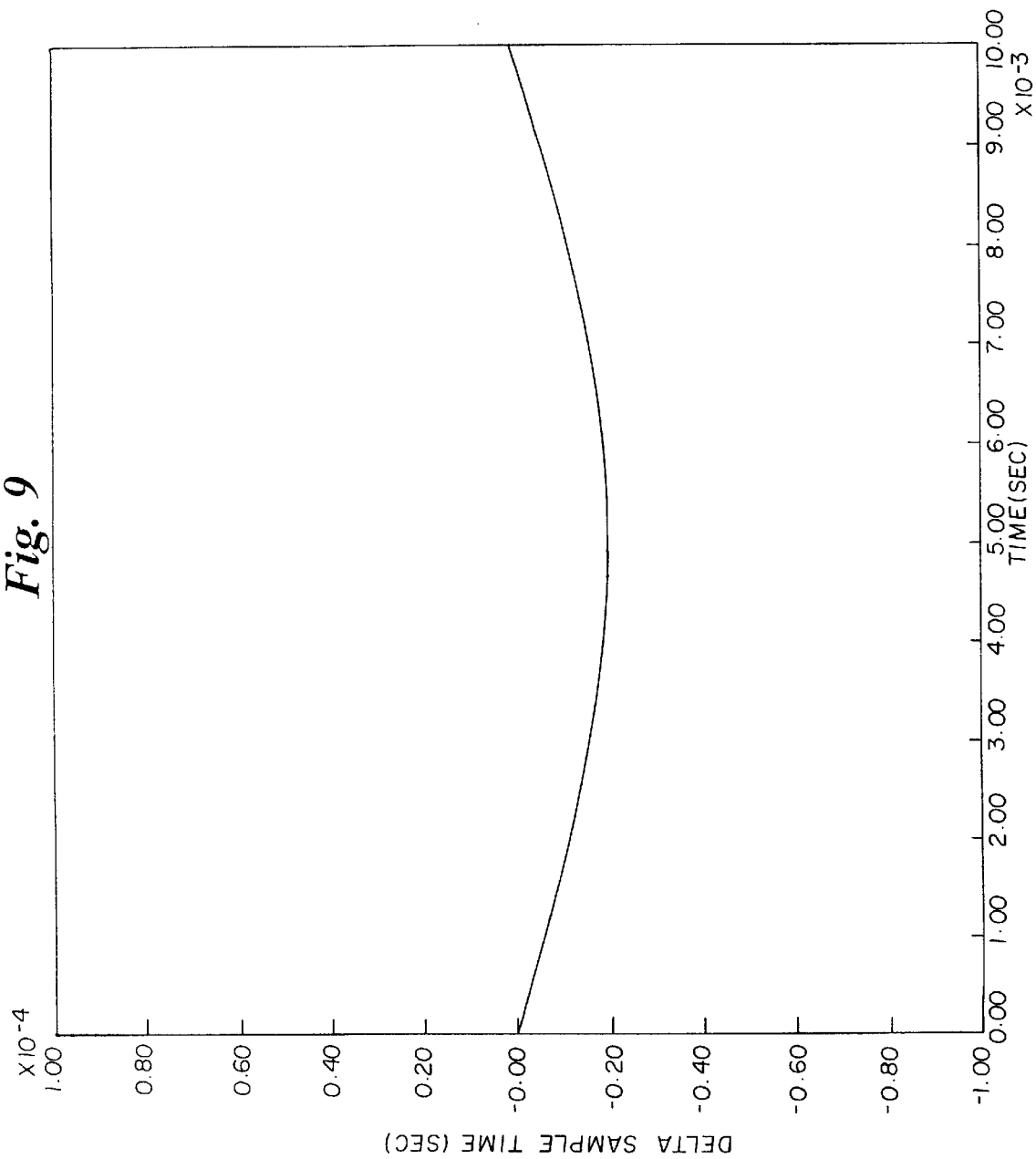
FIG. 9 is a graph showing the nonuniform sample times.
Figure 10:
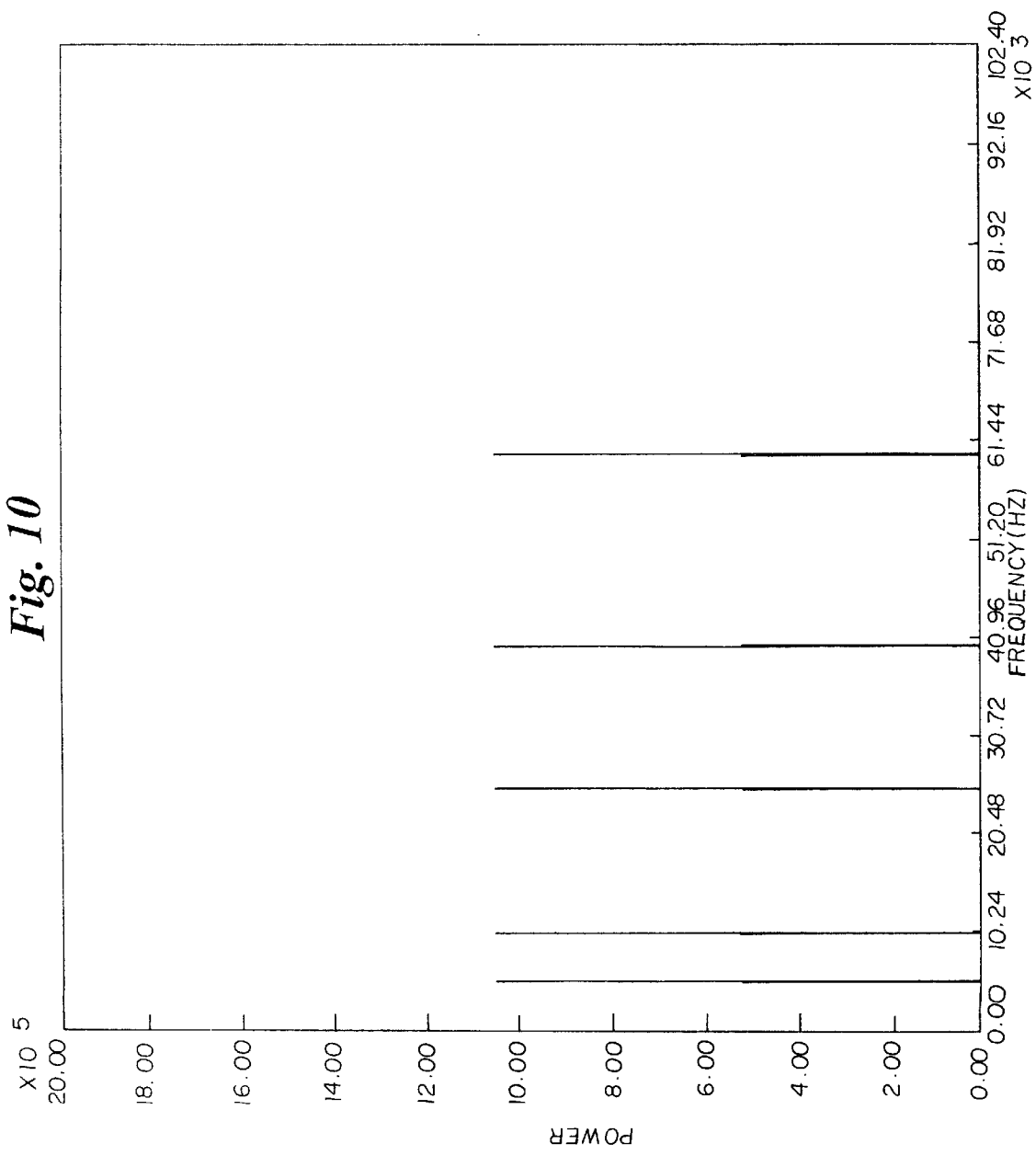
FIG. 10 is a graph showing the received signal spectrum using the nonuniform sample times.

Next the nonuniform sample times $t_k$ were calculated. These times are shown in FIG. 9 as the time difference between the nonuniform sample and the corresponding uniform sample. The half-sinusoid loop seen results from the frequency deviation added to the waveform. Computing the signal series at the nonuniform sample times $t_k$ and Fourier transforming gives the spectrum in FIG. 10. Spectral line broadening has been removed and peak power restored. This is exactly the benefit expected for the inventive FMCW radar system described in this application. Transmitter waveform nonlinearities have been moved by receiver processing.

A final example uses these A(t) coefficients.

| Coefficient | Value | Units |
|---|---|---|
| $a_1$ | 1.0 | MHZ |
| $a_2$ | -1.0 | MHZ |
| $a_3$ | 0 | MHZ |
| $a_4$ | 0 | MHZ |
| $a_5$ | 1.0 | MHZ |
| $a_6$ | -0.2 | MHZ |
| $a_7$ | 3.0 | MHZ |
| $a_8$ | -0.01 | MHZ |
| $a_9$ | 0 | MHZ |
| $a_{10}$ | 0.1 | MHZ |

Figure 11:
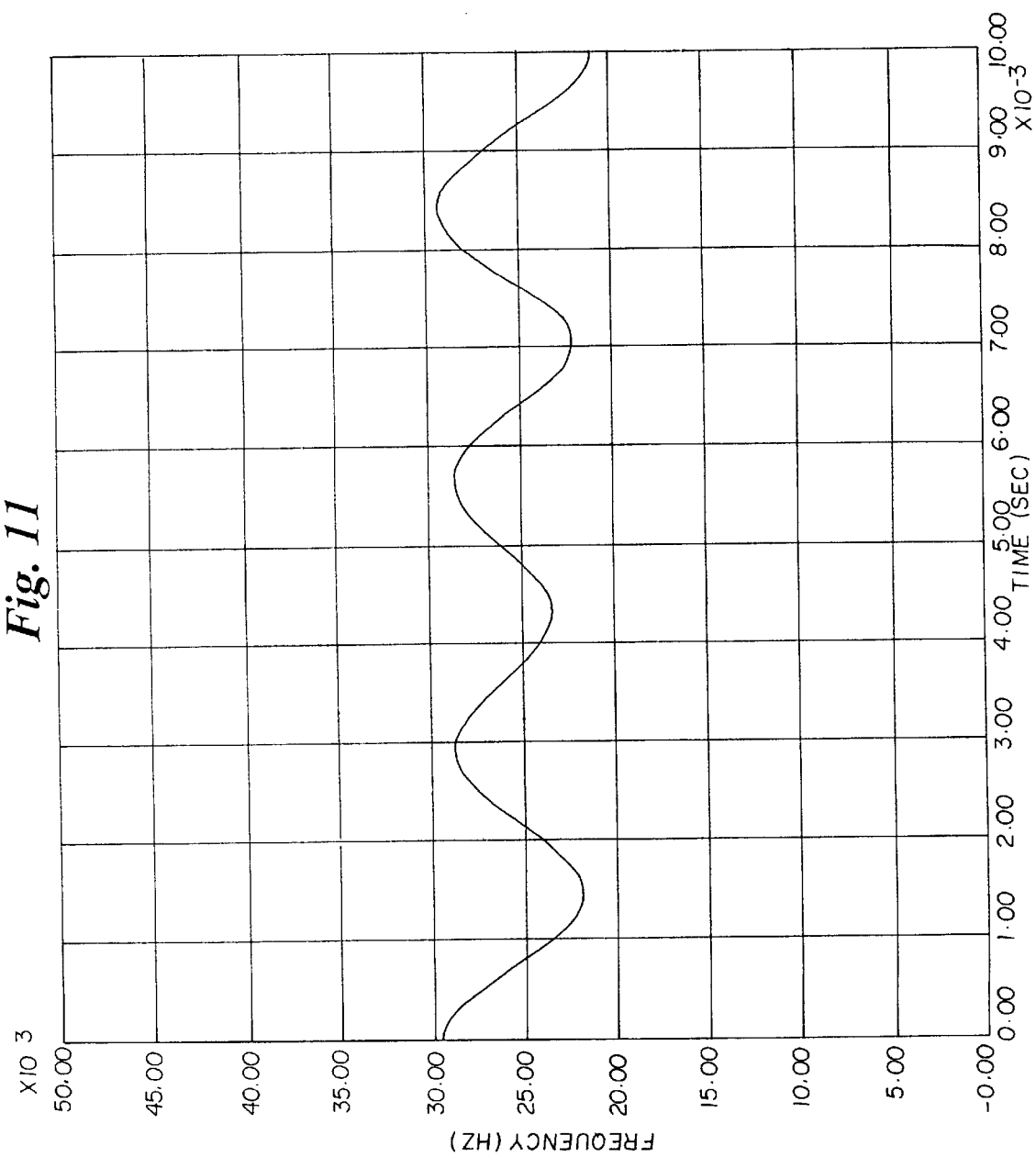
FIG. 11 is a graph of a fixed delay target difference frequency with a second choice of nonlinearity coefficients.
Figure 12:
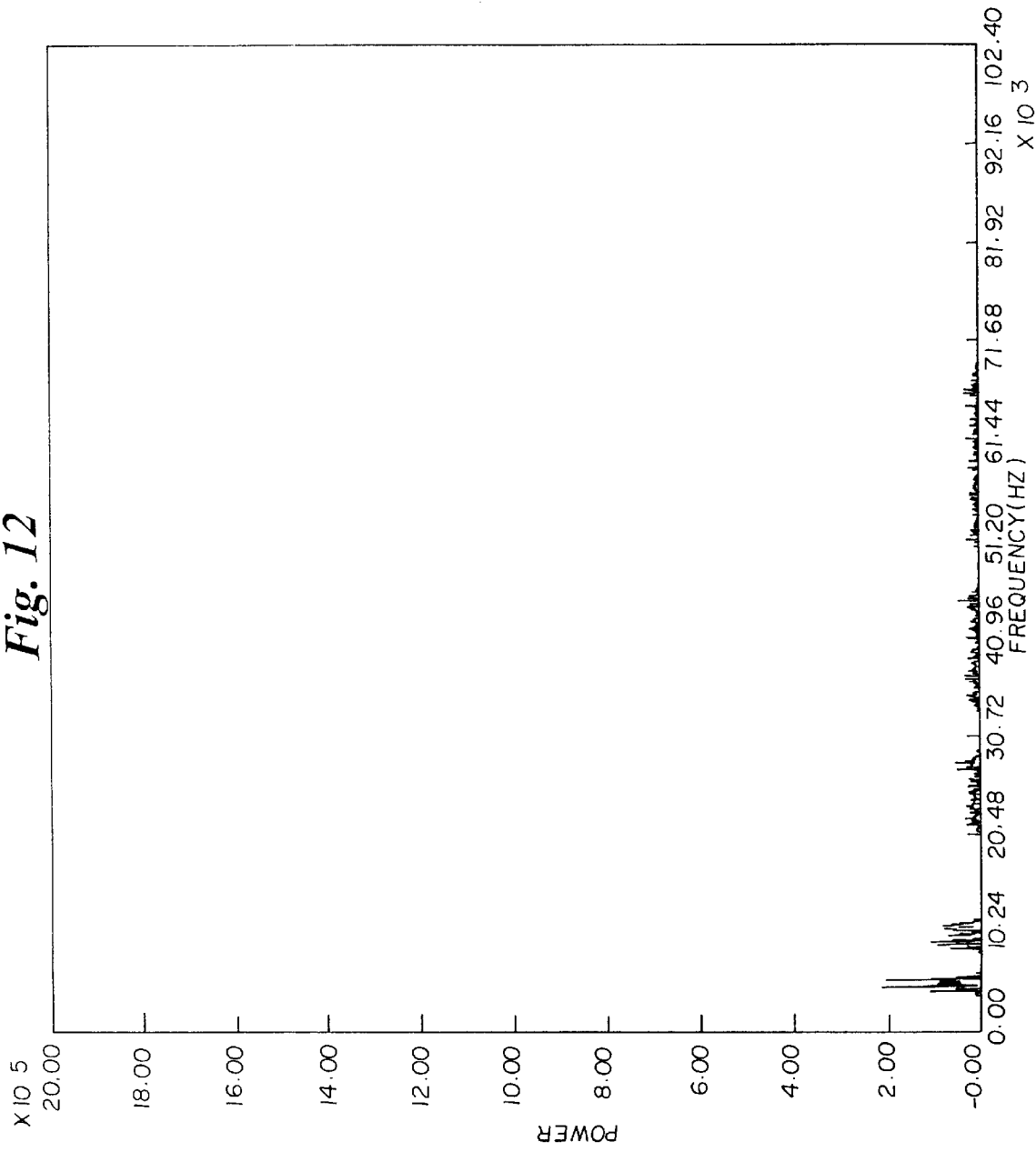
FIG. 12 is a graph of the received signal spectrum with uniform time sampling.
Figure 13:
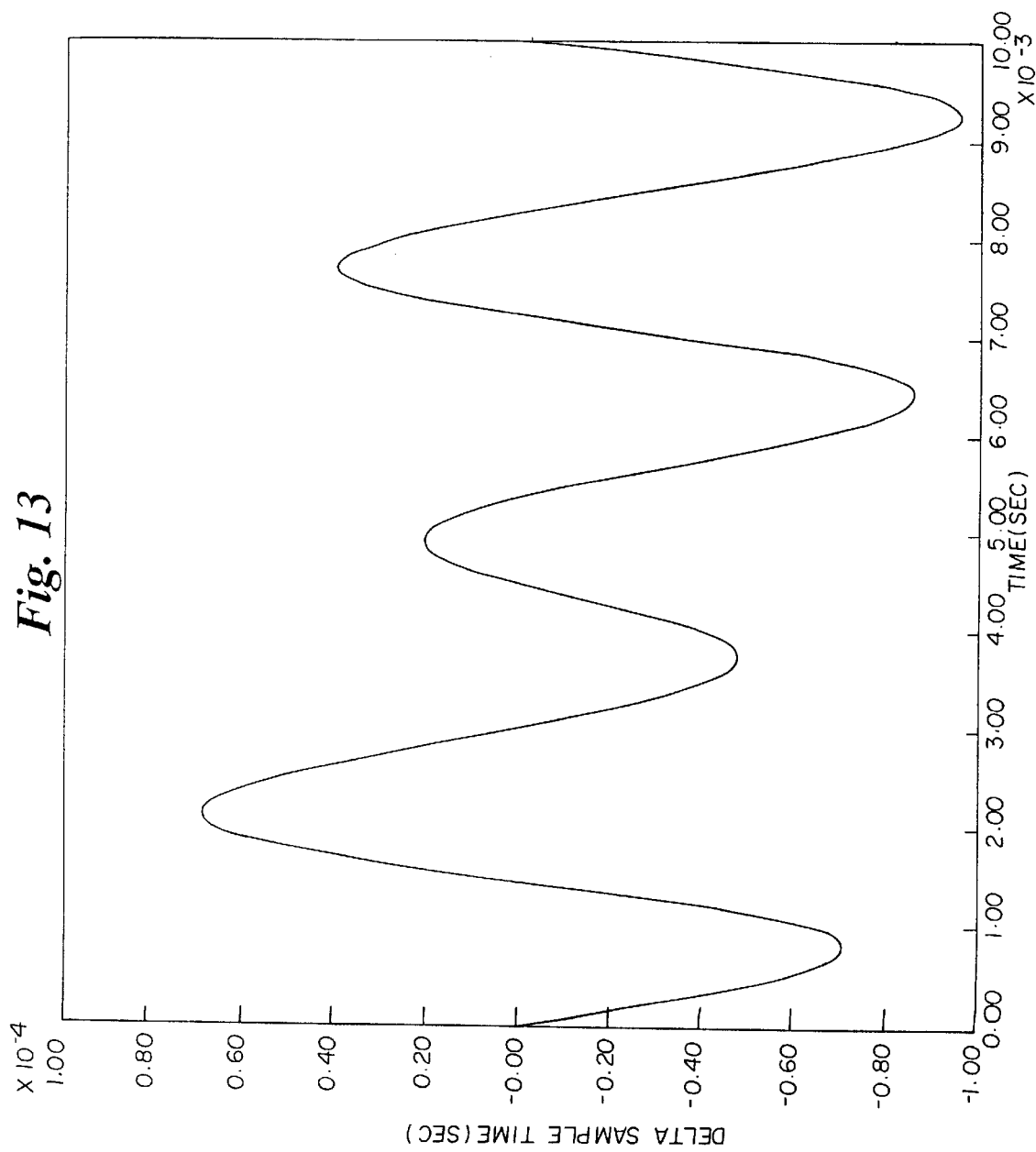
FIG. 13 is a graph of the required nonuniform sample times.
Figure 14:
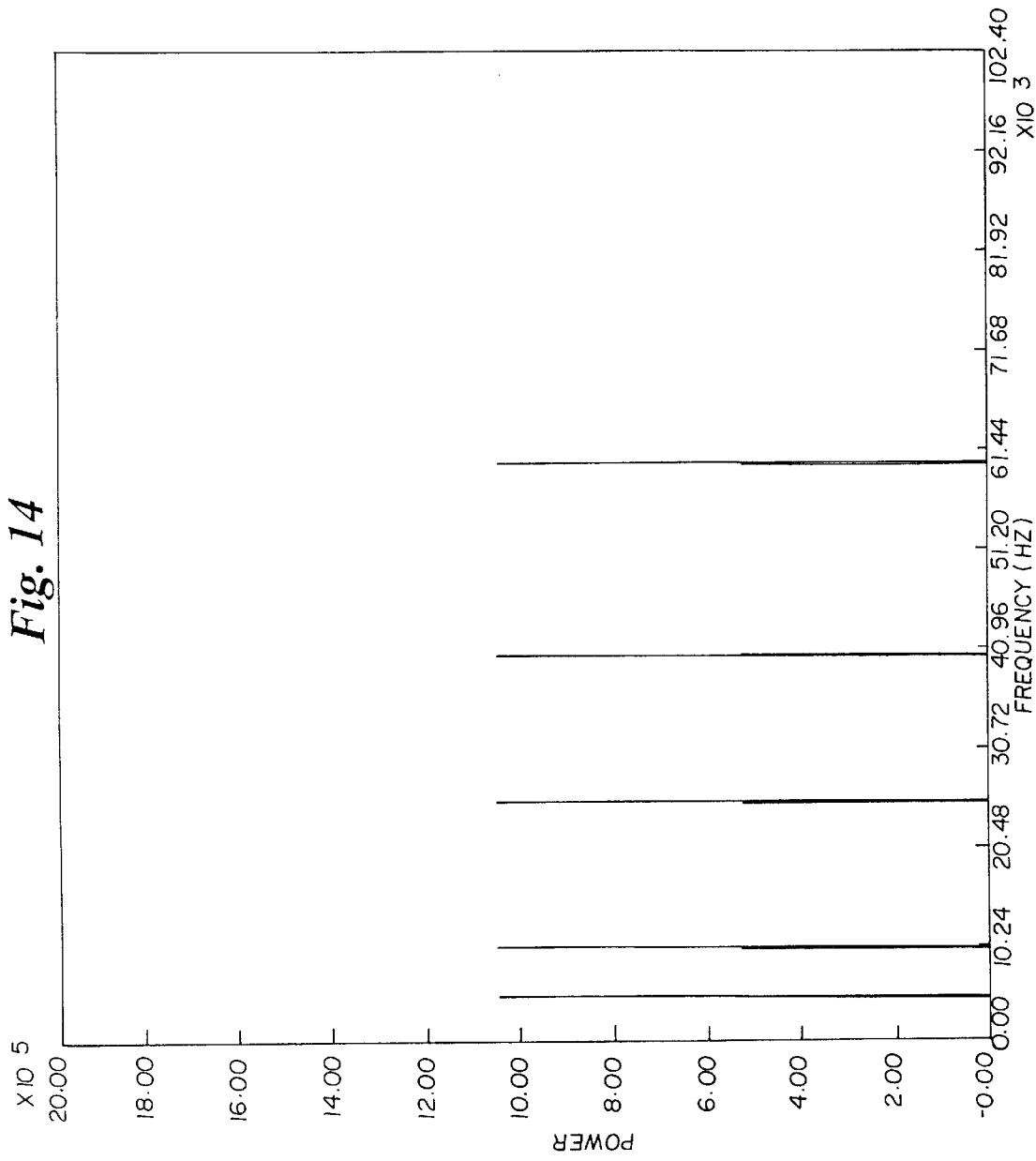
FIG. 14 is a graph of the received signal spectrum when sampled at the nonuniform sample times.

The fixed delay target difference frequency is shown in FIG. 11. Relatively large deviations from the mean frequency are present. FIG. 12 presents the spectrum using uniform sampling. Now the spectral spreading has almost merged the spectral lines for the last two targets. Peak powers are very low. Again calculating the nonuniform sample times produces the curve in FIG. 13 of the time difference between the nonuniform sample and the corresponding uniform sample. Evaluating the signal time series at the nonuniform sample times and Fourier transforming again restores the original signal spectrum. This is shown at FIG. 14 with the five spaced spectral lines of uniform power.

It should be understood that the present invention may be applied to certain simplified radar systems where the linearizer 12 in FIG. 1 is absent. In those systems the RF waveform is solely controlled by the modulator 14 and VCO 10 with no closed loop feedback for waveform control. The present invention may be applied to increase performance of those radar systems by providing a means for sampling the generated RF waveform as shown in FIG. 4 and processing that RF sample through the delay 29, mixer 32, bandpass filter 34, and multiplier 72 to generate the adaptive frequency sample clock applied to A/D converter 50. Frequency discriminator 36, summers 38 and 46, set frequency 40, and lowpass filter 44 need not be implemented.

This completes the description of the preferred and alternate embodiments of the invention. It is to be understood that even though numerous characteristics and advantages of the present invention have been set forth in the foregoing description, together with the details of the structure and function of the invention, the disclosure is illustrative only and changes may be made in detail, especially in matters of shape, size and arrangement of parts within the principals of the invention, to the fill extent indicated by the broad, general meaning of the terms in which the appended claims are expressed. Those skilled in the art may recognize other equivalents to the specific embodiment described herein which are intended to be encompassed by the claims attached hereto.

What is claimed is:

1. In a frequency modulated continuous wave (FMCW) radar system of the type having a voltage controlled oscillator (VCO) for transmitting a RF signal, a linearizer for linearizing the VCO, which receives the transmitted RF signal as an input and outputs a signal to a modulator, which successively sweeps the VCO frequency over a defined range, and a receiver which mixes a return signal with a sample of the transmitted RF signal to derive an IF signal, the improvement comprising:

an adaptive frequency sample clock which drives an analog to digital converter to sample and digitize the IF signal, the clock being derived from the transmitted RF signal.

2. The FMCW radar system of claim 1 wherein the adaptive frequency sample clock provides nonuniform time sampling and uniform phase sampling.

3. The FMCW radar system of claim 2 wherein the output of the linearizer is multiplied in frequency by a fixed factor N to drive the adaptive frequency sample clock.

4. The FMCW radar system of claim 3 wherein N is at least large enough to achieve the Nyquist sampling rate.

5. A frequency modulated continuous wave (FMCW) radar system, comprising:

an rf voltage controlled oscillator (VCO) for transmitting a RF signal;

a linearizer for linearizing the VCO, which receives the transmitted RF signal as an input;

a modulator which receives an output signal from the linearizer and which successively sweeps the VCO frequency over a defined range;

a receiver which mixes a return signal with a sample of the transmitted RF signal to derive an IF signal, and an adaptive frequency sample clock which drives an analog to digital converter to sample and digitize the IF signal, the clock being derived from the transmitted RF signal.

6. The FMCW radar system of claim 5 wherein the adaptive frequency sample clock provides nonuniform time sampling and uniform phase sampling.

7. The FMCW radar system of claim 6 wherein the output of the linearizer is multiplied in frequency by a fixed factor N to drive the adaptive frequency sample clock.

8. The FMCW radar system of claim 7 wherein N is at least large enough to achieve the Nyquist sampling rate.

* * * * *